United States Patent
Demarais

[19]

[11] Patent Number: 6,075,465
[45] Date of Patent: Jun. 13, 2000

[54] DEVICE FOR VALIDATING DIGITAL MESSAGE APPLICABLE IN PARTICULAR TO RAIL TRAFFIC REGULATING SYSTEMS

[75] Inventor: Gérard G. Demarais, Saint Fargeau, France

[73] Assignee: CSEE Transport, France

[21] Appl. No.: 09/070,168

[22] Filed: Apr. 30, 1998

[30] Foreign Application Priority Data

May 7, 1997 [FR] France .................................. 97 05661

[51] Int. Cl.[7] .................................................. G08G 1/097
[52] U.S. Cl. ........................................... 340/931; 363/132
[58] Field of Search ............................. 340/931; 363/131, 363/132; 714/24, 735; 700/4, 79

[56] References Cited

U.S. PATENT DOCUMENTS

| | | | |
|---|---|---|---|
| 4,631,722 | 12/1986 | Voss ............................................. | 371/9 |
| 4,816,960 | 3/1989 | Littler et al. ................................. | 371/9 |

FOREIGN PATENT DOCUMENTS

| | | |
|---|---|---|
| 1354941 | 5/1974 | United Kingdom . |
| WO 96/33086 | of 1996 | WIPO . |

*Primary Examiner*—Daryl Pope
*Attorney, Agent, or Firm*—Anthony J. Casella; Gerald E. Hespos; Michael J. Porco

[57] ABSTRACT

Device for validating digital messages, applicable, in particular, to rail traffic regulating systems, of the type in wihch the absolute identity and the dynamic state of two digital messages (A and B) originating from two processing channels in parallel are checked, before producing, by means of an output amplifier (6), an on/off analogue safety signal (S) ensuring the operation of an actuator, characterised in that it further includes a Wheatstone diode bridge (1), the alternate inputs (2 and 3) of which are supplied respectively by the two messages (A, B), previously inverted in relation to one another, and the continous diagonal of which comprises an oscillator (4) the output (s) cf which constitutes the identity check signal for the messages (A, B), this signal controlling the output amplifier (6) via a static relay (5).

16 Claims, 4 Drawing Sheets

DEVICE FOR VALIDATING DIGITAL MESSAGE APPLICABLE IN PARTICULAR TO RAIL TRAFFIC REGULATING SYSTEMS

BACKGROUND OF THE INVENTION

Field of the Invention

The present invention relates to a device for validating digital messages, of the type in which the absolute identity and the dynamic state of two digital messages originating from two processing channels in parallel are checked, prior to producing, by means of an output amplifier, an on/off analogue safety signal ensuring the operation of an actuator.

In any system of operation liable, following malfunctions, even if only hypothetical, to affect the safety of persons served by this system, it is absolutely vital to organise the system so that it can guarantee, whatever the disturbances or deterioration contemplated, that it is completely impossible for situations to occur that are dangerous both for such persons and for the equipment controlled by the said system.

For this purpose, the corresponding automatic devices are designed and organised in such a way that any malfunction necessarily places the system either in a state of more restricted operation (the slowing down, or even halting of rolling stock, for example), or in a state of absolute safety (cutting off the power supply, for example).

While the fail-safe concept of safety, which is widely used in the field of rail transport, makes use of only one processing channel, this cannot apply to automatic devices based upon digital management which could, in this case, guarantee only a level of safety which, while high, was probabilistic, and non-absolute.

However, the interpretation and management power of digital systems is such that this solution is chosen increasingly often, although this choice makes it necessary to use two processing channels in parallel, for which rigorously identical results are demanded.

For this purpose, use is made of a circuit designed to be fail-safe and which constitutes the decision making or validating component and which performs the intersection function causing the results from the two digital processing channels to converge. After the absolute identity and the dynamic state of the two binary messages originating from the digital processing channels have been checked, the said validating circuit decides to send the corresponding on/off orders to the actuator or actuators of the system.

It will be noted as of now that these messages are recurrent. In other words, each of them is constituted by a sequence of several bytes transmitted in series and continuously, "bit by bit". In addition, the software of the digital processing channels is organised in such a way that the transmitted messages never comprise more than a few successive bits, for example three, at the same binary value, which makes it possible to check their dynamic state. Thus, in the event of a "freezing", simultaneous or otherwise, of the messages transmitted by the two processing channels, the system must declare itself defective by switching over automatically to the safety condition.

In the present state of the art, the first of the two validation functions, namely the identity checking of the messages, necessitates a circuit of the type shown in FIG. 1, comprising, for the two messages, X and Y, at least two complementary inverters, two logic AND gates and one logic OR gate. As to the second validation function, namely the dynamic checking of the messages, this necessitates a circuit of the type shown in FIG. 2, comprising at least three logic AND gates and two fall time delay devices.

Such circuits are, in appearance, very simple, but, when they are designed to be fail-safe, they require a very large number of components, which leads to equally severe crowding, for instance on the surfaces of the printed circuits.

SUMMARY OF THE INVENTION

The main object of the present invention is thus to remedy this drawback and, to do so, it provides a digital message validating device of the aforementioned type, which is essentially characterised in that it includes a Wheatstone diode bridge, the alternate entries of which are supplied respectively with the two messages, previously inverted in relation to one another, and the continuous diagonal of which comprises an oscillator, the output of which constitutes the message identity check signal, this signal controlling the output amplifier via a static relay.

Thus, the oscillator can function only if the two digital messages are perfectly identical, or, more precisely, complementary, bit by bit in fact, which ensures absolute safety.

The device according to the invention further includes two diode pumps supplied, respectively, by two digital messages and operating on the transitions of the changes of state of the messages, these two diode pumps providing, via an OR gate, the voltage needed to supply the static relay.

Thus, the static relay can control the operation of the output amplifier only if the two digital messages originating from the processing channels are both identical and non-"frozen". It thus very conveniently performs the intersection function for the two checks, namely the identity checking and the dynamic state checking of the two messages.

It will further be noted that, according to the invention, these two checking functions can be provided on a printed circuit surface that is several hundreds of times smaller than it is in the prior art and, what is more, in complete safety.

The device according to the intention also includes an arming system comprising two other diode pumps, one supplied by an arming control signal from the digital processing channels and the other by a self-maintaining signal from the output amplifier, these two diode pumps providing, via an OR gate, the supply voltage needed for the operation of the oscillator.

There is thus obtained a pyramidal structure in which each stage obtains its energy from the preceding one, which precludes any accidental backfeeding of a strategic circuit by a spurious signal or the mains supply.

Preferably, the oscillator of the Wheatstone bridge is provided with a fall time delay device, which makes it possible to accept slight desynchronisation between the two digital messages.

Preferably also, the first two diode pumps are connected to the alternate inputs of the Wheatstone bridge, which provides an additional check on the levels of the signals at these inputs.

BRIEF DESCRIPTION OF THE DRAWINGS

Further characteristics and advantages will emerge more clearly from the following description of a form of embodiment of the invention, given by way of a non-limitative example with reference to the annexed drawings, in which FIG. 1, already mentioned, is a diagram of a conventional circuit enabling the identities of two digital messages to be checked.

DETAILED DESCRIPTION OF THE PREFERRED EMBODIMENTS

Figure 1:
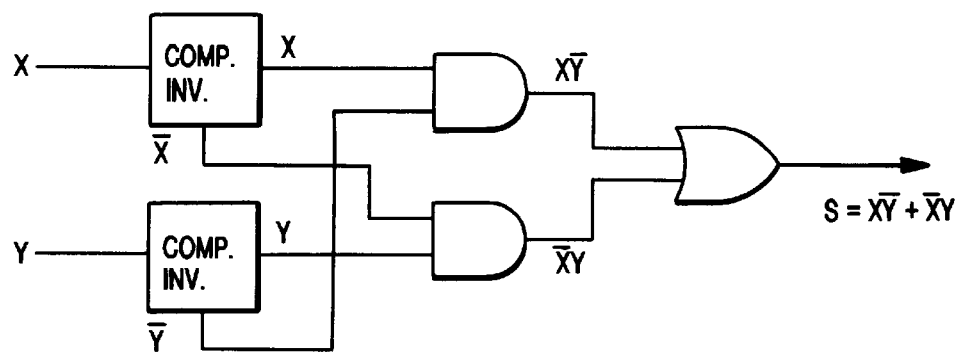
Figure 2:
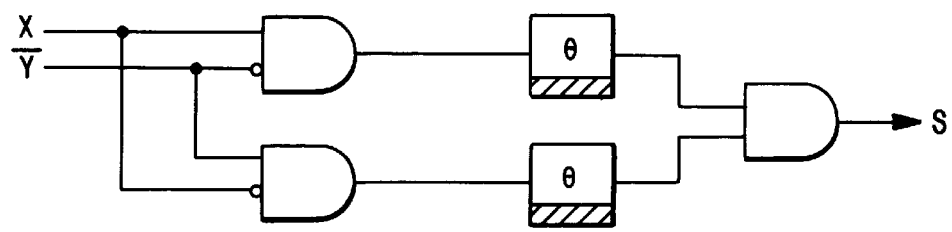
FIG. 2, also already mentioned, is a diagram of a conventional circuit enabling the dynamic state of the two messages to be checked.
Figure 3:
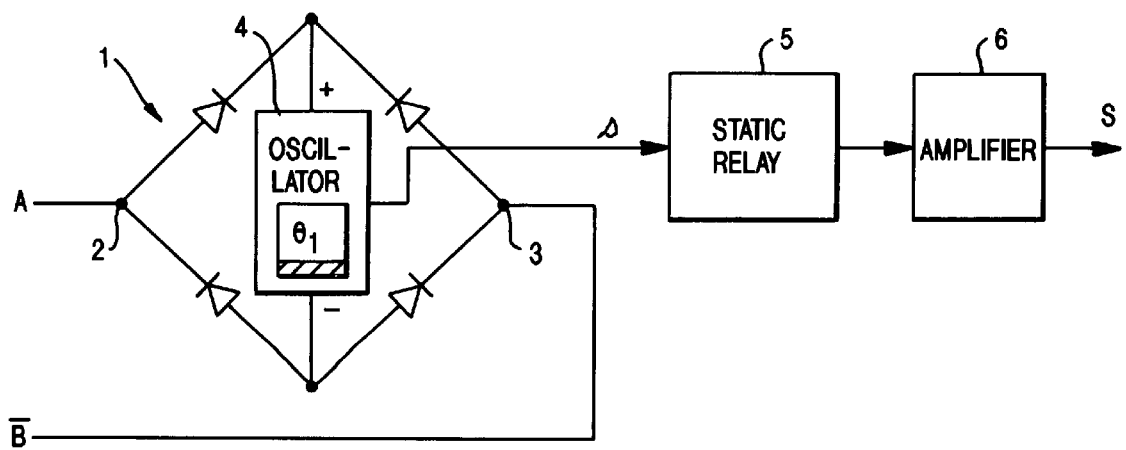
FIG. 3 is a simplified diagram of a circuit according to the invention enabling the identities of the messages to be checked.

The diagram of FIG. 3 shows a circuit according to the invention enabling the identities of two digital messages, A and B, originating from two processing channels in parallel, not shown, to be controlled. This Circuit is essentially constituted by a Wheatstone diode bridge 1, the alternate entries 2 and 3 of which are supplied respectively by message A and by message B, preferably inverted by some means $\overline{B}$. In the continuous diagonal of this Wheatstone bridge 1 is connected an oscillator 4, the output signal s of which controls, via a static relay 5, the operation of an output amplifier 6.

Thanks to this arrangement, oscillator 4 can function, and thus transmit an output signal s to static relay 5, only if the two digital messages, A and B, are perfectly identical or, more precisely, if the levels of the two messages A and $\overline{B}$ are in perfect opposition, bit by bit. Static relay 5 thus ensures the operation of amplifier 7, which then transmits at its output an on/off analogue safety signal S to one or more actuators, not shown, constituted, for example, in the case of a rail traffic regulating system, by safety relays ensuring the operation of signal lights.

Oscillator 4, of a type known per se, is advantageously of the digital type and will be constituted, for example, by an RC circuit associated with a group of inverters. In addition, this oscillator is equipped with a fall time delay device $\theta_1$ permitting a holding operation at the time of binary changes in the values of the bits making up messages A and B, which permits slight desynchronisation or macrosynchronisation between the two messages. Reasonable availability of the device is thus guaranteed without having recourse to a synchronous clock common to the two digital processing channels, with the risk of a common mode liable to generate incorrect identical codes on the two channels through the effect of a spurious signal.

It will be noted, moreover, that such an identity check circuit can be produced on a printed circuit surface that is approximately 900 times smaller than that occupied by a conventional fail-safe type circuit. This advantageously makes it possible to mount several actuator commands on one and the same standardised format printed circuit board.

Figure 4:
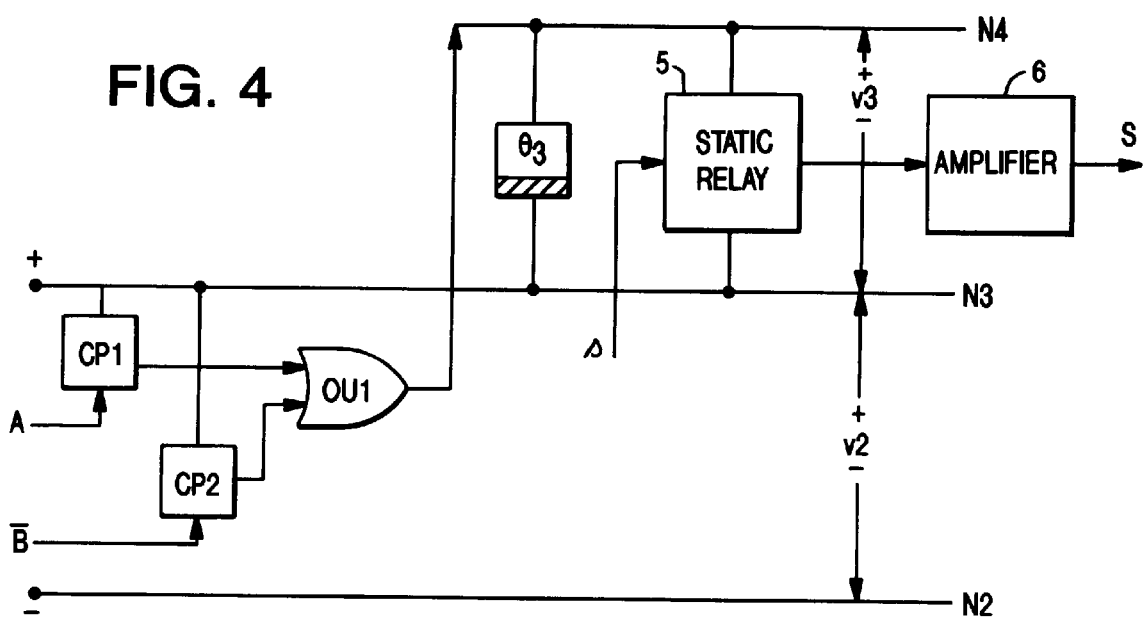
FIG. 4 is a simplified diagram of a circuit according to the invention enabling the dynamic state of the messages to be checked.

With reference, now, to FIG. 4, there can be seen a circuit according to the invention for checking the dynamic state of messages A and B. This circuit is essentially constituted by two diode pumps CP1 and CP2 supplied respectively by the two digital messages A and B or A and $\overline{B}$. Preferably, the two diode pumps will be connected directly to the alternate inputs 2 and 3 of the Wheatstone bridge 1, hence supplied by A and $\overline{B}$, thus providing an additional check on the levels of the signals on these inputs.

Diode pumps CP1 and CP2 use the transitions corresponding to the changes of state of messages A and B and are associated with an OR gate OU 1 providing, from a voltage v2, the voltage v3 necessary for supplying static relay 5, as will be more clearly apparent hereinafter. A fall time delay device $\theta_3$ is further provided on voltage v3, this time delay device permitting adjustment of the acceptable time of non dynamisation of the two digital messages A and B, before triggering of the switch-off of the validation device and the fall of the signal, with transmission of the safety information S to the actuators, via static relay 5 controlling output amplifier 6. Static relay 5 performs the intersection function for the two checks, the identity check and the dynamic state check on messages A and B, and it can control the operation of output amplifier 6 only if these two messages are simultaneously identical (or, more precisely, complementary) and non-"frozen".

Figure 5:
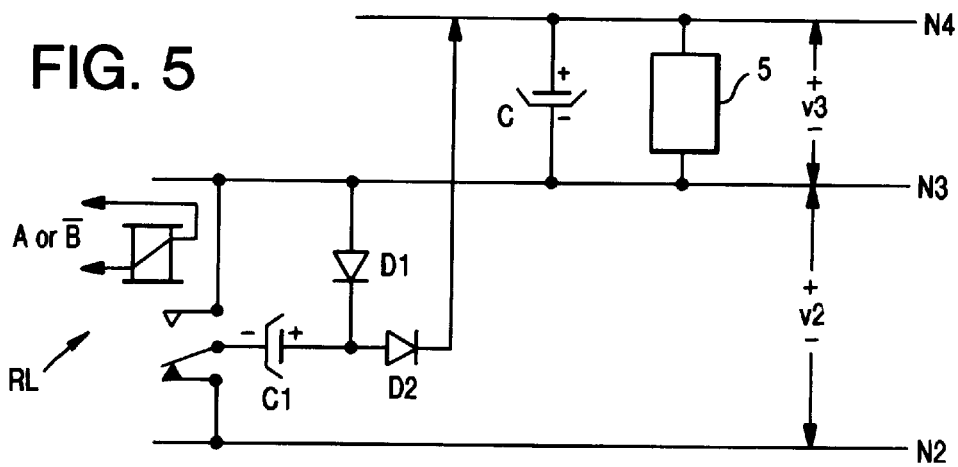
FIG. 5 is a diagram of a circuit illustrating the diode pump principle.

The operating principle of a diode pump will now be explained with reference to FIGS. 5 and 6. In the diagram of FIG. 5, one sees first of all a relay RL controlled by message A or B, and which is connected across voltage v2. It will be noted, however, straight away, that, in reality, the part of relay RL is played by a static inverter, which will be described in greater detail hereinafter. At the centre point of relay RL is connected a capacitor C1, which is connected, by diodes in opposition D1 and D2, respectively to the + of v2 and to the + of v3. Across voltage v3 is connected a filtering capacitor C, in parallel on the user circuit formed here by static relay 5.

Figure 6:
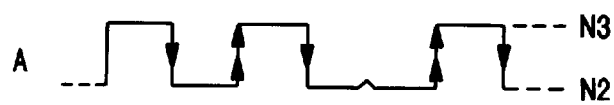
FIG. 6 is a signal diagram illustrating the operation of the circuit shown in FIG. 4.
Figure 6:
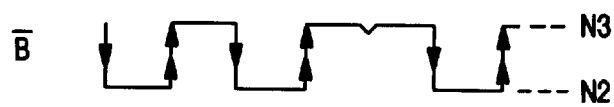
Figure 6:

Thus, the negative transitions of messages A or $\overline{B}$, represented in FIG. 6 by a single arrow, "arm" the diode pump, that is to say they load capacitor C1 via diode D1. As to the positive transitions of messages A or $\overline{B}$, represented in FIG. 6 by two arrows, they cause the − of C1 to change to the + of v2, so that there occurs a transfer of energy from C1 to filtering capacitor C via. diode D2. Voltage v3 needed for the operation of static relay 5 is thus gradually produced across filtering capacitor C, as illustrated in the diagram of FIG. 6.

It is to be noted here that the inversion of B in relation to A has the additional advantage of permitting alternate recharging of voltage v3 by diode pumps CP1 and CP2.

It will thus be seen, in the final analysis, that diode pumps CP1 and CP2 produce, from voltage v2 used as an energy source, voltage v3, which lies potentially above v2, since the − of v3 is referenced to the + of v2 ; in this way, it is possible to avoid the risk of accidental backfeeding, through leakage or the like, of a safety circuit by some service supply, which is a matter of constant concern in the field of electronics of fail-safe design. There is, in fact, to begin with, a first possibility of leakage, between the + of v3 and the − of v2, but, in this case, the voltage on the user circuit 5 would be inverted, hence inoperative. There is also a second possibility of leakage, between the +of v2 and the + of v3, but, then, voltage v3 across user circuit 5 would become nil, and thus also inoperative. In addition, as the energy of v3 derives from that of v2, any transfer of energy from v3 to v2 is completely impossible.

Figure 7:
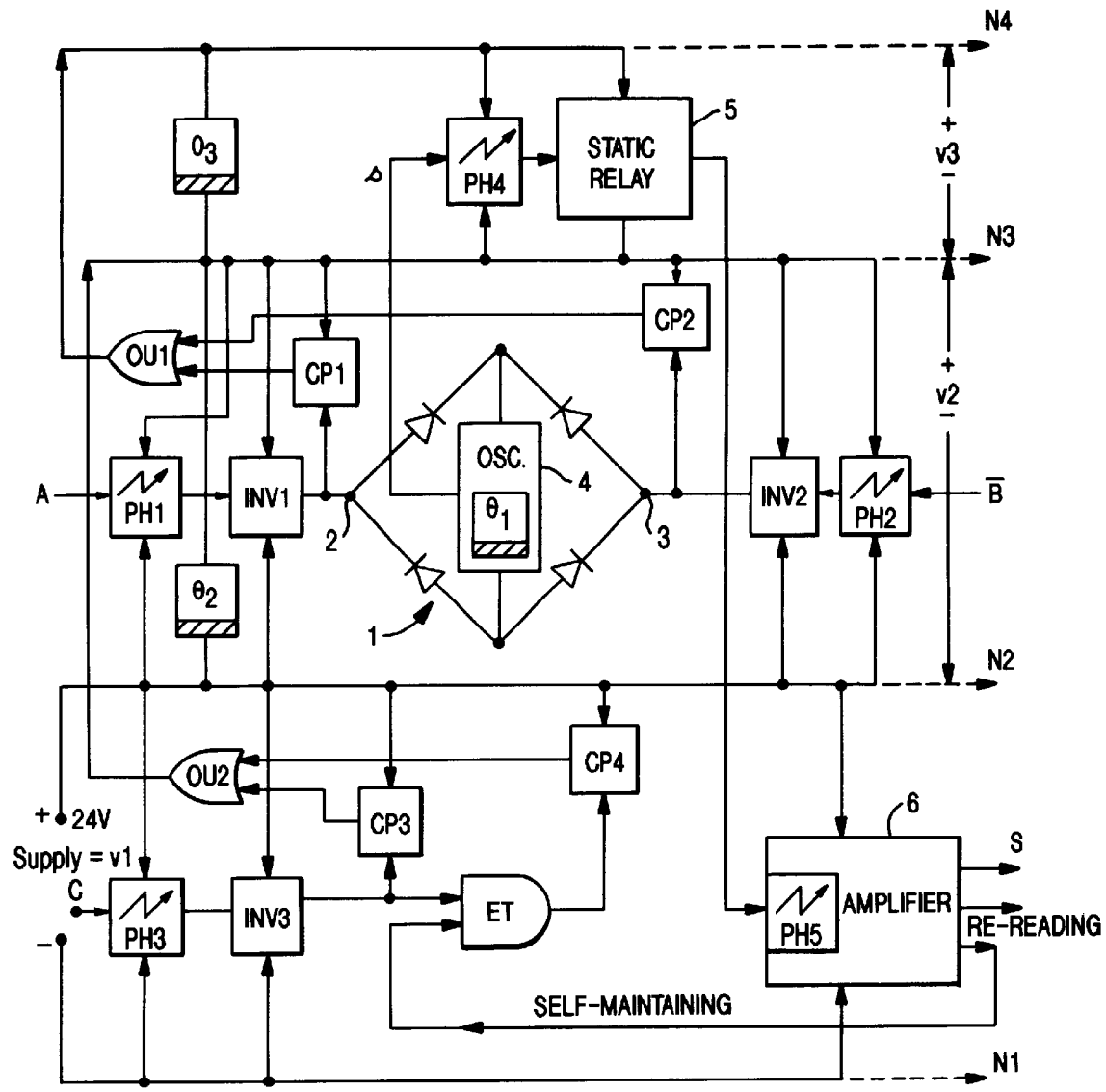
FIG. 7 is a diagram of the complete circuit of the validation device according to the invention.

The complete circuit of the validation device according to the invention is shown in FIG. 7. This figures shows again, first of all, Wheatstone bridge 1, oscillator 4 with its fall time delay device $\theta_1$, and static relay 5 controlling output amplifier 6. The figure also shows the two diode pumps CP1 and CP2 associated with OR gate OU 1 and fall time delay device 83 connected between levels N3 and N4 of voltage v3.

The two digital messages A and B are, in fact, applied to the alternate inputs 2 and 3 of Wheatstone bridge 1 via photoelectric couplers, PH1 and PH2, respectively, and via static inverters, INV1 and INV2, respectively, connected between levels N2 and N3 of voltage v2. The photoelectric couplers provide galvanic insulation of the signals, while the inverters regenerate the level of the signals. The latter function, in reality, as on/off level amplifiers, at the top or bottom limit on levels N3 or N2 of the supply constituted by voltage v2, at the rhythm of the input signal. They also play the part of the relay RL shown in FIG. 5 in the case of diode pumps CP1 and CP2.

According to the invention, this validation device is also equipped with an entirely static arming system, essentially constituted by two other diode pumps, CP3 and CP4, associated with an OR gate OU 2, the output of which is connected to level N3 of voltage v2. An arming control signal C, constituted by a long signal, supplies diode pump CP3 via a photoelectric coupler PH3 and a static inverter INV3, connected between levels N1 and N2 of voltage v1, constituted, for example, by the 24V supply voltage of the local mains. As to diode pump CP4, this is supplied from a self-maintaining signal originating from output amplifier 6, via an AND gate receiving at its other input the arming control signal C. It will be noted here that output amplifier 6 comprises, in addition to the output of safety signal S, a third, insulated output or "rereading" output intended for the two digital processing channels.

Voltage v2 needed for the operation of diode pumps CP1 and CP2 is thus produced by diode pumps CP3 and CP4 from voltage v1 of the local mains. A fall time delay device 82 is further provided on voltage v2, in order to adjust the time required for the energy provided by CP4 by means of the self-maintaining signal to take over from the initial energy provided by CP3 by means of arming control signal C.

It will further be noted that, in diode pump CP3, diode DI of FIG. 5 is remplaced by a simple resistor, which makes it possible to control at will the time selected for the arming command. It is, in fact the long arming signal C in its entirety that charges capacitor C1 of FIG. 5, and not just its negative edge.

It should also be noted here that OR gates OU 1 and OU 2 correspond, in fact, simply to the parallel connection of the cathodes of the diodes D2 shown n FIG. 5.

One thus obtains, in the final analysis, a pyramidal architecture of the different suppliesi in which each stages draws its energy from the preceding stage, which makes it possible to avoid any accidental backfeeding of a strategic circuit. Voltage v2, contained between levels N2 and N3, draws its energy, in fact, from voltage v1, contained between levels N1 and N2, which is the mains supply, this being by means of diode pumps CP3 and CP4, recapitulated by OR gate OU 2. As to voltage v3, contained between levels N3 and N4, it draws its energy from voltage v2 by means of diode pumps CP1 and CP2, recapitulated by OR gate OU 1. This voltage v3 constitutes the safety information used by static relay 5 which it controls "supply-wise", the said static relay performing the intersection function for the identity and dynamic state check information for the two digital messages A and B.

Finally, it will be noted that the circuit shown in FIG. 7 also includes two other photoelectric couplers, PH4 and PH5, inserted respectively between oscillator 4 and static relay 5, and between this static relay and output amplifier 6. These photoelectric couplers provide an electrical insulation function, between v2 and v3 in the case of PH4, and between v3 and v1, in that of PH5. Any input/output out leakage of these photocouplers would have no effect other than that of levels N3 and N4 approaching N2, whence a gradual disappearance of v3, and then of v2, leading to the fall of safety signal S, with transmission of the safety information the actuators.

There will now be described an example of the operation of the validating device according to the invention, with more particular reference to the signal diagram of FIG. 8, which again shows the two digital messages A and B, arming command signal C, the arming energy of diode pump CP3, the signal s from oscillator 4, and the signals from output amplifier 6, that is to say safety output signal S properly speaking, the re-reading signal and the self-maintaining signal.

When the validation device is off, i.e. in its safety condition, voltages v2 and v3 are nil. so that levels N3 and N4 are at the potential of N2.

The process for initialising a system equipped with such a device can then take place as follows:

The microprocessors or other circuits of the two digital processing channels continuously examine the incident information arriving at their inputs and carry out the scheduled self-tests. The corresponding digital results are subjected to an inter-channel comparison via exchanges of the transcoded results to avoid any accidental copying of one of the results by the other. If, for each channel, these results are corroborated by those of the other channel, a joint decision is made by the microprocessors to arm the validation device.

For this purpose, an arming command signal C is transmitted for the time needed for charging capacitor C1 of diode pump CP3. It should be noted that this arming command signal simultaneously cuts off the self-maintaining signal supplying diode pump CP4, via the AND gate, to cater for the possibility of a spurious pulse while the validation device was on, that is to say in state "1".

The microprocessors of the two channels are organised to cause the beginning of the series transmission of the two digital messages A and B to coincide with the fall of arming signal C, at time t1. At this moment, the fall of signal C causes the output of inverter INV3 to change to the potential of N2, following on from which the energy of CP3 acquired during the arming command is transferred to level N3. Voltage v2 is thus formed, so that oscillator 4 can commence operating, at time t2, insofar as the two messages A and B are indeed present and complementary.

The first transitions of messages A and B gradually establish voltage v3 contained between levels N3 and N4, via the diode pumps CP1 and CP2 of OR gate OU 1, as illustrated in FIG. 6. Static relay 5 is thus supplied and can then control the operation of output amplifier 6.

Figure 8:
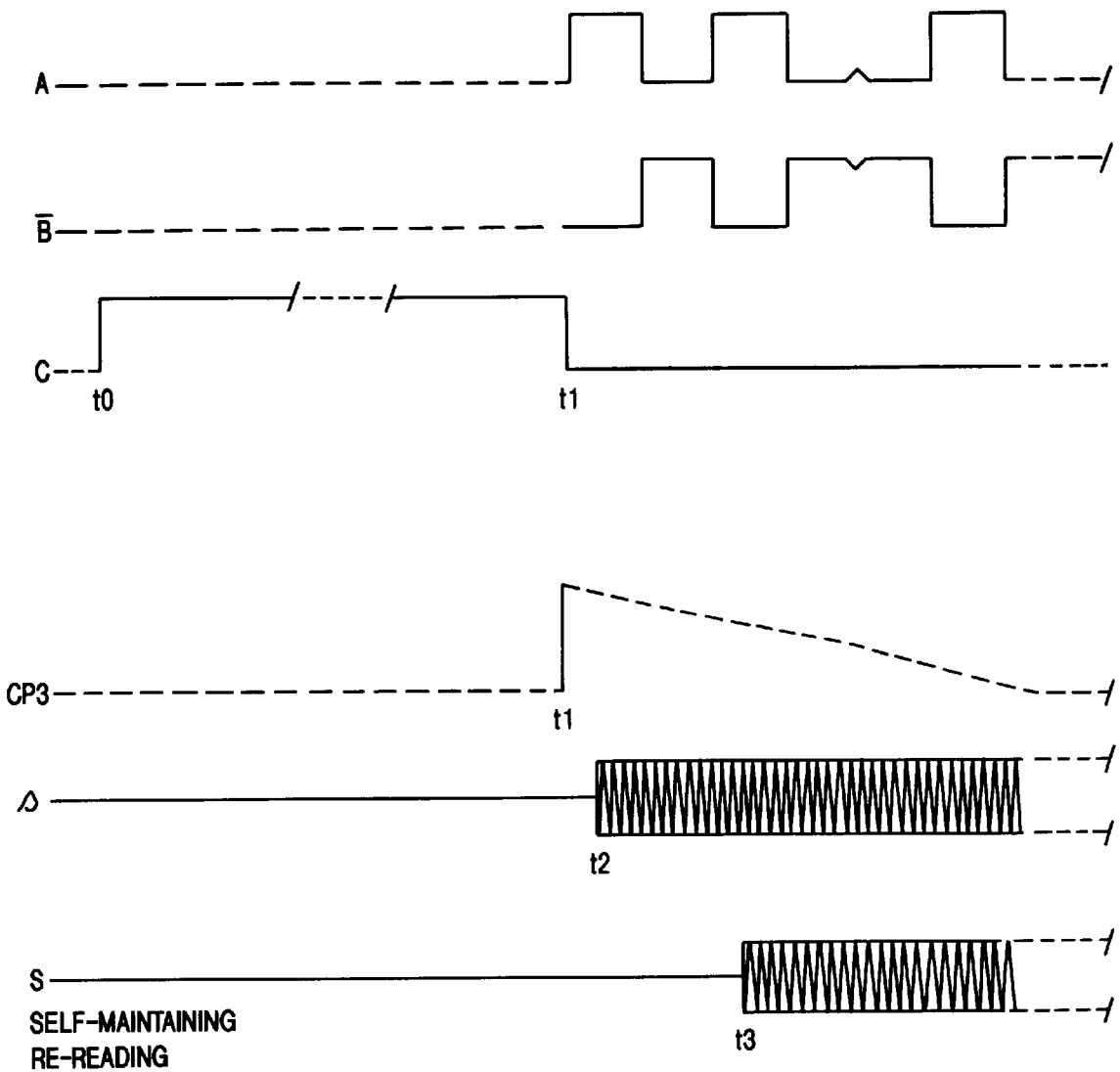
FIG. 8 is a signal diagram illustrating the operation of this circuit.

After a time t3–t1, representing the time delay required for establishment of voltage v3, the self-maintaining signal occurs at the output of amplifier 6, as does the re-reading signal for the digital processing channels and the safety signal S for the actuators, as illustrated in FIG. 8. It will be noted that all these signals are alternating on/off signals.

The initial energy supplied by diode pump CP3 is then non longer needed, and it is the energy provided by the self-maintaining signal, by means of diode pump CP4, which takes over.

If the self-maintaining signal is now interrupted for a time incompatible with $\theta_2$ and $\theta_3$, levels N3 and N4 fall and the validation device as a whole turns off irreversibly, as a result of cancellation of supply voltages v2 and v3, which constitutes, in effect, an absolute defect memory.

The digital message validating device that just has been described can clearly be applied to particular advantage to systems for the automatic piloting of trains and controlling their movements, but it can also be applied, in general, to any industrial field in which an on/off safety signal has to be supplied on the basis of detection of an input signal, for example to safely shut down a machine or an industrial process.

It should further be noted that such a device can be produced on a very small printed circuit surface. By way of example, in a practical embodiment using hybrid circuit technology, it proved possible to accomodate the whole of the device on a surface area not exceeding 3 cm².

What is claimed is:

1. Device for validating digital messages, of the type in which the absolute identity and the dynamic state of two digital messages (A and B) from two processing channels in parallel are checked before producing, by means of an output amplifier, an on/off analog safety signal (S) ensuring the operation of an actuator, characterized in that it further includes a Wheatstone diode bridge, alternate inputs of which are supplied, respectively, by the two messages (A, B), previously inverted in relation to one another, and a continuous diagonal of which comprises an oscillator, an output (s) of which constitutes an identity checking signal for the messages (A, B), this signal controlling the output amplifier relay.

2. Device according to claim 1, characterized in that it further includes two diode pumps (CP1, CP2) supplied respectively by the two digital messages (A, B) and operating on transitions of changes of state of the messages, these two diode pumps (CP1, CP2) providing, via an OR gate (OU 1), the voltage (v3) necessary to supply the static relay (5).

3. Device according to claim 2, characterized in that it further includes an arming system comprising two other diode pumps (CP3, CP4), one (CP3) supplied by an arming command signal (C) from the processing channels, and the other (CP4) by a self-maintaining signal from the output amplifier, these two diode pumps (CP3, CP4) providing, via an OR gate (OU 2), the supply voltage (v2) necessary for the operation of the oscillator.

4. Device according to claim 3, characterized in that the oscillator of the Wheatstone bridge is provided with a fall time delay device (θ1).

5. Device according to claim 2, characterized in that the first two diode pumps (CP1, CP2) are connected to the alternate inputs of the Wheatstone bridge.

6. Device according to claim 5, characterized in that the two digital messages (A, B) are applied to the Wheatstone bridge via photoelectric couplers (PH1, PH2).

7. Device according to claim 6, characterized in that a first photoelectric coupler (PH4) is inserted between the oscillator and the static relay and a second photoelectric coupler (PH5) is inserted between the static relay (5) and the output amplifier.

8. Device according to claim 3, characterised in that the arming command signal (C) is applied to the corresponding diode pump (CP3) via a photoelectric coupler (PH3).

9. Device according to claim 8, characterized in that a fall time delay device ($θ_2$) is provided on the supply voltage (v2) of the oscillator.

10. Device according to claim 9, characterized in that a fall time delay device ($θ_3$) is provided on the supply voltage (v3) of the static relay.

11. Device according to claim 1, characterized in that the oscillator of the Wheatstone bridge is provided with a fall time delay device (θ1).

12. Device according to claim 2, characterized in that the oscillator of the Wheatstone bridge is provided with a fall time delay device (θ1).

13. Device according to claim 2, characterized in that the two digital messages (A, B) are applied to the Wheatstone bridge via photoelectric couplers (PH1, PH2).

14. Device according to claims 2, characterized in that a first photoelectric coupler (PH4) is inserted between the oscillator and the static relay and a second photoelectric coupler (PH5) is inserted between the static relay and the output amplifier.

15. Device according to claim 3, characterized in that a fall time delay device (θ2) is provided on the supply voltage (v2) of the oscillator.

16. Device according to claim 2, characterized in that a fall time delay device (θ3) is provided on the supply voltage (v3) of the static relay.

* * * * *